United States Patent
Masuda

(10) Patent No.: US 8,203,151 B2
(45) Date of Patent: Jun. 19, 2012

(54) SEMICONDUCTOR DEVICE AND METHOD FOR FABRICATING THE SAME

(75) Inventor: Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/906,579

(22) Filed: Oct. 18, 2010

(65) Prior Publication Data

US 2011/0024769 A1 Feb. 3, 2011

Related U.S. Application Data

(62) Division of application No. 12/593,130, filed as application No. PCT/JP2008/054257 on Mar. 10, 2008, now Pat. No. 7,981,709.

(30) Foreign Application Priority Data

Apr. 5, 2007 (JP) ................. 2007-099541

(51) Int. Cl.
*H01L 29/04* (2006.01)
*H01L 29/15* (2006.01)
*H01L 29/00* (2006.01)
*H01L 29/80* (2006.01)
*H01L 29/768* (2006.01)

(52) U.S. Cl. ............ 257/77; 257/49; 257/103; 257/521; 257/628; 257/221; 257/224; 257/240; 257/241; 257/243; 257/287; 257/E21.065; 257/E21.066; 257/E21.461

(58) Field of Classification Search ........... 257/E21.065, 257/E21.066, E21.461
See application file for complete search history.

(56) References Cited

U.S. PATENT DOCUMENTS

| | | | |
|---|---|---|---|
| 6,097,039 A * | 8/2000 | Peters et al. ............ | 257/77 |
| 6,214,108 B1 | 4/2001 | Okamoto et al. | |
| 6,273,950 B1 | 8/2001 | Kitabatake | |
| 6,706,586 B1 | 3/2004 | Collins et al. | |
| 7,563,321 B2 * | 7/2009 | Powell et al. ............ | 117/84 |
| 2004/0159841 A1 | 8/2004 | Hisada et al. | |
| 2005/0230686 A1 | 10/2005 | Kojima et al. | |
| 2005/0233539 A1 * | 10/2005 | Takeuchi et al. ........ | 438/400 |
| 2007/0155165 A1 | 7/2007 | Park et al. | |
| 2007/0209573 A1 * | 9/2007 | Kusunoki et al. ........ | 117/28 |
| 2008/0050844 A1 | 2/2008 | Masuda | |
| 2008/0299718 A1 | 12/2008 | Jiang et al. | |
| 2009/0230404 A1 * | 9/2009 | Masuda et al. .......... | 257/77 |

FOREIGN PATENT DOCUMENTS

| | | |
|---|---|---|
| EP | 2 015 363 A1 | 1/2009 |
| JP | 2000-294777 | 10/2000 |
| JP | 2005-166930 | 6/2005 |
| JP | 2006-344942 | 12/2006 |
| JP | 2009-170457 | 7/2009 |

* cited by examiner

*Primary Examiner* — Mohsen Ahmadi
(74) *Attorney, Agent, or Firm* — Venable LLP; Michael A. Sartori; Leigh D. Thelen

(57) ABSTRACT

A method for fabricating a semiconductor device includes the steps of forming a SiC film, forming trenches at a surface of the SiC film, heat-treating the SiC film with silicon supplied to the surface of the SiC film, and obtaining a plurality of macrosteps to constitute channels, at the surface of the SiC film by the step of heat-treating. Taking the length of one cycle of the trenches as L and the height of the trenches as h, a relation $L=h(\cot \alpha + \cot \beta)$ (where $\alpha$ and $\beta$ are variables that satisfy the relations $0.5 \leq \alpha$, $\beta \leq 45$) holds between the length L and the height h. Consequently, the semiconductor device can be improved in property.

8 Claims, 10 Drawing Sheets

(a)

(b)

SEMICONDUCTOR DEVICE AND METHOD FOR FABRICATING THE SAME

CROSS-REFERENCE TO RELATED APPLICATIONS

This application is a Divisional of U.S. patent application Ser. No. 12/593,130 filed Sep. 25, 2009, which is a 371 of PCT/JP2008/054257, filed Mar. 10, 2008, which claims the benefit of Japan Patent Application No. 2007-099541, filed Apr. 5, 2007, all of which are incorporated herein by reference in their entirety.

TECHNICAL FIELD

The present invention relates to a semiconductor device and a method for fabricating the same, and more particularly to a semiconductor device including a semiconductor film made of silicon carbide (SiC), and a method for fabricating such a semiconductor device.

BACKGROUND ART

SiC, having a wide bandgap and a maximum dielectric field greater by about one order of magnitude than that of silicon (Si), is a promising material expected to be applied to next-generation power semiconductor devices. SiC has so far found application to various electronic devices through use of single crystal wafers of 4H—SiC or 6H—SiC, and is considered to be particularly suitable for high-temperature, high-power devices. The above-mentioned crystal is alpha-phase SiC with a zinc-blende structure and a wurtzite structure stacked one upon the other. Prototypes of other semiconductor devices are being fabricated from a beta-phase SiC crystal of 3C—SiC. Recently, prototypes of Schottky diodes, MOS-FETs (metal oxide semiconductor field-effect transistors), thyristors and the like have been fabricated as power devices. It has been confirmed that such devices have properties much more favorable than those of conventional Si semiconductor devices.

In a semiconductor device through use of SiC, particularly in a MOSFET having a channel formed at the surface of a SiC substrate, the surface obtained by high-temperature annealing has been conventionally used for the channel. However, the surface of the SiC substrate obtained by high-temperature annealing has random irregularities, which increases the interface state density. The carrier mobility is thereby reduced, resulting in degraded properties of the semiconductor device.

A technique that may solve the problem is disclosed in, for example, Japanese Patent Laying-Open No. 2006-344942 (Patent Document 1). Patent Document 1 discloses forming two trenches at the surface of a SiC film, and then heat-treating the SiC film with silicon (Si) supplied to the surface of the SiC film. As a result, a facet (macrostep) whose length of one cycle is 100 nm or more is formed between the trenches. A terrace of the macrostep constitutes a channel of a MOSFET.

Patent Document 1: Japanese Patent Laying-Open No. 2006-344942

DISCLOSURE OF THE INVENTION

Problems to be Solved by the Invention

However, in the fabrication method according to Patent Document 1, the macrostep is formed only between the two trenches, and no macrostep can be formed at any other position. Thus, although a single semiconductor device can be fabricated, devices such as transistors cannot be formed cyclically at the surface of the semiconductor film. Accordingly, properties cannot be improved sufficiently.

It is therefore an object of the present invention to provide a semiconductor device with improved properties, and a method for fabricating such a semiconductor device.

Means for Solving the Problems

A semiconductor device according to the present invention includes a semiconductor film made of SiC. The semiconductor film has, at a surface thereof, a plurality of macrosteps of an equal length. The plurality of macrosteps constitute at least one channel.

By virtue of the macrosteps constituting at least one channel in the semiconductor device according to the present invention, the interface state density of the portions to constitute the channel can be reduced, which improves the carrier mobility. The semiconductor device can therefore be improved in property. Further, since a plurality of macrosteps of an equal length are obtained, elements such as transistors of a semiconductor device can be formed cyclically at the surface of the semiconductor film. The semiconductor device can therefore be improved in property.

It is to be noted that one channel may be formed of a plurality of macrosteps, or just one macrostep.

Preferably, in the semiconductor device according to the present invention, at least one of the plurality of macrosteps includes a {0001} plane. The {0001} plane is inclined in a <1-100> orientation within a range of −30° to +30°.

Accordingly, the flatness (linearity) of the macrosteps can be improved significantly.

Preferably, in the semiconductor device according to the present invention, the surface of the semiconductor film has a plane orientation inclined at an angle greater than or equal to 0.5° and less than or equal to 56° with respect to the {0001} plane.

Preferably, in the semiconductor device according to the present invention, at least one of the plurality of macrosteps includes a plane forming an angle of 55°±5°, 62°±5° or 90°±5° with respect to the {0001} plane, when viewed in a cross section perpendicular to the plurality of macrosteps.

Since the above-mentioned planes are all stable, the usage of any of these planes to constitute the macrosteps allows termination of the growth of the macrosteps.

A method for fabricating a semiconductor device according to one aspect of the present invention includes the steps of forming a semiconductor film made of SiC, forming three or more trenches at a surface of the semiconductor film at equal intervals, heat-treating the semiconductor film with silicon supplied to the surface of the semiconductor film, and obtaining a plurality of macrosteps to constitute at least one channel, at the surface of the semiconductor film by the step of heat-treating.

With the method for fabricating a semiconductor device according to one aspect of the present invention, controlling the length of one cycle and depth of each trench allows the macrosteps to be controlled in size. A semiconductor device in which large macrosteps constitute at least one channel and having desired properties can be obtained. Since forming three or more trenches at equal intervals provides a plurality of macrosteps of an equal length, elements such as transistors of a semiconductor device can be formed cyclically at the surface of the semiconductor film. The semiconductor device can therefore be improved in property.

A method for fabricating a semiconductor device according to another aspect of the present invention includes the steps of forming a semiconductor film made of SiC, forming trenches at a surface of the semiconductor film, heat-treating the semiconductor film with silicon supplied to the surface of the semiconductor film, and obtaining a plurality of macrosteps to constitute at least one channel, at the surface of the semiconductor film by the step of heat-treating. Taking the length of one cycle of the trenches as L and the depth of the trenches as h, a relation L=h(cot α+cot β) (where α and β are variables that satisfy relations 0°≦α+β≦90° and 0.5°≦α<β) holds between the length L of one cycle and the depth h.

The inventor of the present invention and others have found that there is a geometrical relationship between length L of one cycle and height h of the trenches and the shape of the macrosteps obtained after the heat treatment, and the above-mentioned expressions hold. With the method for fabricating a semiconductor device according to the other aspect of the present invention, since trenches are formed based on this geometrical relationship, large macrosteps can be obtained. Since these macrosteps constitute at least one channel, the semiconductor device can be improved in property.

Preferably, in the method for fabricating a semiconductor device according to the present invention, the length L of one cycle of the trenches is greater than or equal to 1.5 μm and less than or equal to 1152 μm, and the depth h of the trenches is greater than or equal to 0.1 μm and less than or equal to 20 μm. More preferably, the depth h of the trenches is less than or equal to 15 μm.

Effects of the Invention

With the semiconductor device and the method for fabricating such a semiconductor device according to the present invention, improved properties can be obtained.

DESCRIPTION OF THE REFERENCE SIGNS

1, 1b, 1c macrostep; 1a bunching step; 2, 2a to 2c, 3, 3a to 3c crystal plane; 10 SiC substrate; 11 SiC film; 12a, 12b n-type impurity region; 13 insulation film; 14a, 14b hole; 16 channel; 17a source electrode; 17b drain electrode; 18 gate electrode; 20 trench; 21 mesa portion; 30, 32, 33 resist; 31 coating film; 50 MOSFET; 90 semiconductor device.

BEST MODES FOR CARRYING OUT THE INVENTION

In the following, an embodiment of the present invention will be described with reference to the drawings.

Figure 1:
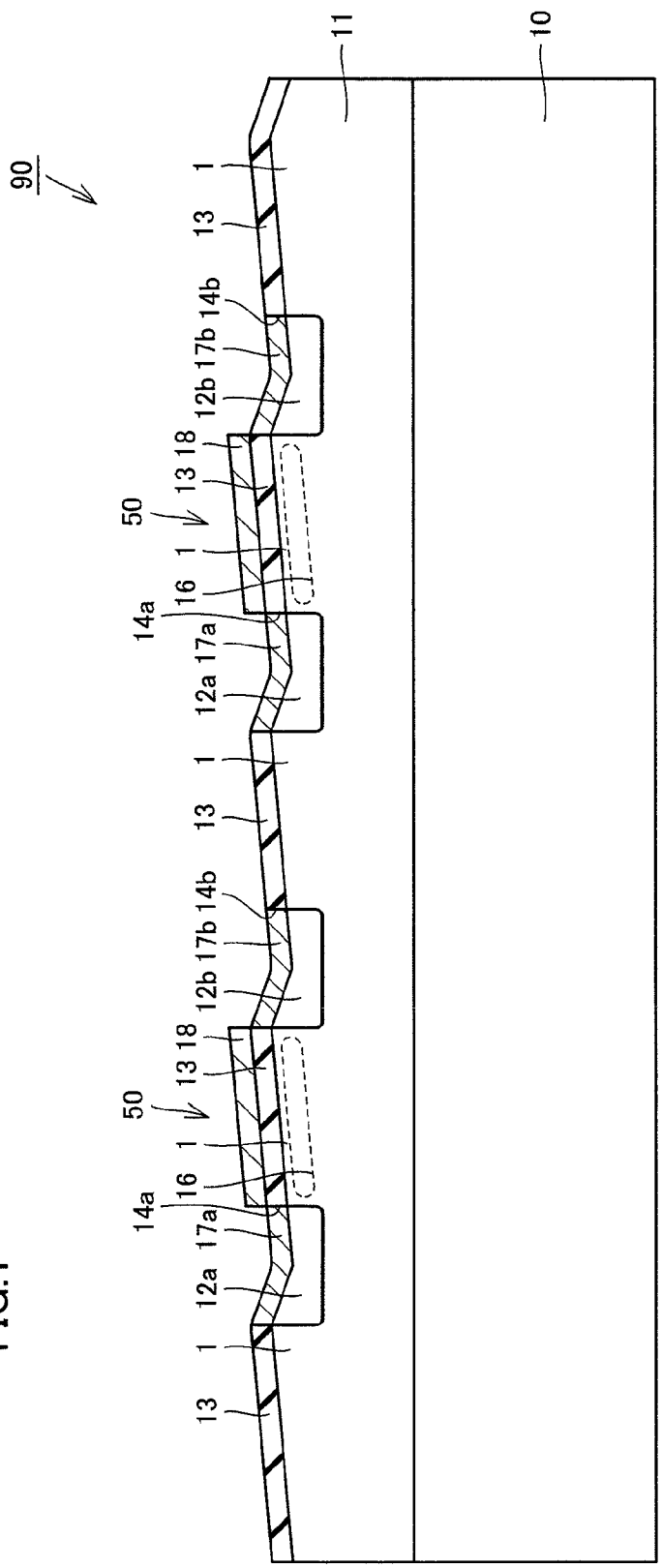
FIG. 1 is a sectional view of a structure of a semiconductor device according to one embodiment of the present invention.

FIG. 1 is a sectional view of a structure of a semiconductor device according to one embodiment of the present invention. With reference to FIG. 1, a semiconductor device 90 according to the present embodiment includes a SiC substrate 10, a p-type SiC film 11 as a semiconductor film made of SiC and a plurality of MOSFETs 50. SiC film 11 is formed on SiC substrate 10, and each of MOSFETs 50 is formed at the surface of SiC film 11.

SiC crystal constituting SiC substrate 10 is formed, for example, such that a (0001) plane or a (000-1) plane is inclined in a [1-100] orientation at an angle within a range of −30° to +30° (i.e., such that the plane has an off-angle ranging from −30° to +30°. Alternatively, SiC substrate 10 may have a plane orientation inclined by 0.5° to 56° with respect to the (0001) plane or (000-1) plane. SiC film 11 is homoepitaxially grown on SiC substrate 10, and inherits the crystalline structure of SiC substrate 10.

Figure 2:
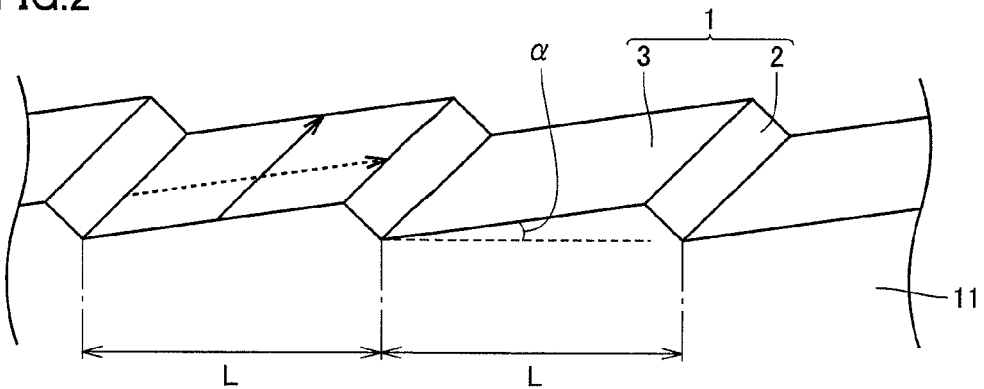
FIG. 2 is an enlarged perspective view of two macrosteps shown in FIG. 1.

SiC film 11 has a plurality of macrosteps 1 at a surface thereof. FIG. 2 is an enlarged perspective view of two macrosteps shown in FIG. 1. With reference to FIG. 2, as viewed microscopically, SiC film 11 has an uneven irregular surface on which plurality of macrosteps 1 are formed in a certain cycle. Each of macrosteps 1 includes a crystal plane 2 (riser) and a crystal plane 3 (terrace) larger than crystal plane 2. Crystal plane 3 is a (0001) plane or a (000-1) plane, for example. The angle of inclination of crystal plane 3 in the lateral direction of FIG. 2 is an off-angle α of SiC film 11. When viewed in a cross section perpendicular to the macrosteps, for example, crystal plane 2 includes a plane forming an angle of 55°±5°, 62°±5° or 90°±5° with respect to a {0001} plane. Alternatively, each macrostep may further include a crystal plane other than crystal planes 2 and 3. Each of macrosteps 1 has a length (length of one cycle) L of 100 nm or more, for example. Crystal plane 3 has a length of 2 μM, for example.

Herein, the length of one cycle of macrosteps refers to the length of macrosteps 1 in a direction along the surface of SiC film 11 (in the lateral direction of FIG. 2) as viewed macroscopically. Similarly, the length of a crystal plane refers to the length of the crystal plane in the direction along the surface of SiC film 11 as viewed macroscopically.

A structure of MOSFETs 50 according to the present embodiment will now be described in detail.

With reference to FIG. 1, each of MOSFETs 50 includes n-type impurity regions 12a and 12b, an insulation film 13, a source electrode 17a, a gate electrode 18 and a drain electrode 17b. N-type impurity regions 12a and 12b are formed at the surface of SiC film 11, and have an impurity concentration higher than that of SiC film 11. Insulation film 13 is formed on SiC film 11. A plurality of holes 14a and 14b are formed in insulation film 13. N-type impurity regions 12a and 12b are formed at the surface of SiC film 11 at the bottom of holes 14a and 14b, respectively. Source electrode 17a is formed on the surface of n-type impurity region 12a. Drain electrode 17b is formed on the surface of n-type impurity region 12b. Herein, forming n-type impurity regions 12a and 12b at positions where source electrode 17a and drain electrode 17b are in contact with SiC film 11 can reduce the contact resistance between source electrode 17a, drain electrode 17b and SiC film 11. Gate electrode 18 is formed on insulation film 13 at a portion located between source electrode 17a and drain electrode 17b. Insulation film 13 thereby constitutes a gate insulation film of MOSFET 50, and macrostep 1 of SiC film 11 located directly vertically under insulation film 13 constitutes a channel 16 of MOSFET 50.

In MOSFET 50, electrons are accumulated at channel 16 by a voltage applied to gate electrode 18, so that a current flowing between source electrode 17a and drain electrode 17b is controlled. In the present embodiment, since MOSFET 50 is of the lateral type, the current across source electrode 17a and drain electrode 17b flows substantially in parallel to the surface of SiC film 11.

It is to be noted that the structure of semiconductor device 90 shown in FIG. 1 is an example of the semiconductor device according to the present invention. The semiconductor device according to the present invention may have another structure, as long as macrosteps constitute channels.

A method for fabricating semiconductor device 90 according to the present embodiment will now be described with reference to FIGS. 3 through 13.

Figure 3:
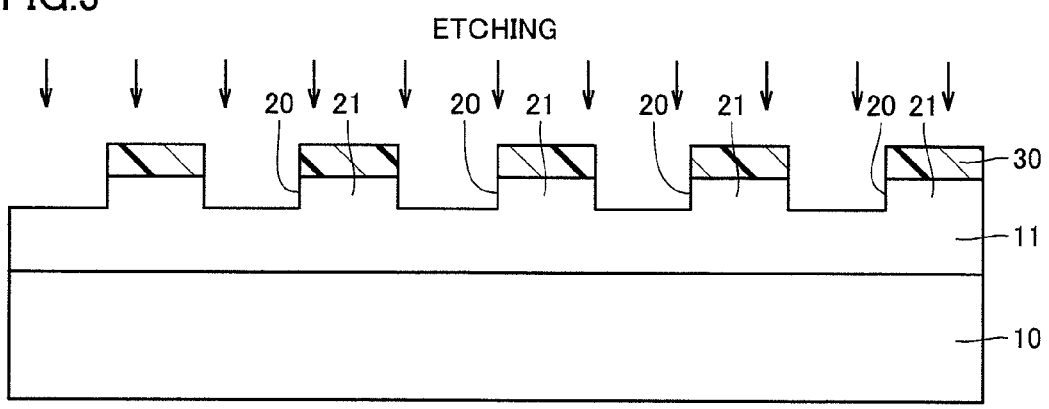
FIG. 3 is a sectional view of a semiconductor device according to one embodiment of the present invention, illustrating a first step in a fabrication method thereof.

First, with reference to FIG. 3, SiC film 11 is epitaxially grown on SiC substrate 10. At this stage, SiC film 11 has numerous random irregularities (steps) at the surface thereof. Then, resist 30 having a predetermine shape is formed on SiC film 11, and SiC film 11 is etched with resist 30 serving as a mask. Trenches 20 of an equal depth are thereby formed at equal intervals at the surface of SiC film 11, and a mesa portion 21 is formed between each two of trenches 20. Resist 30 is thereafter removed. Three or more trenches 20 are formed, for example.

Figure 4:
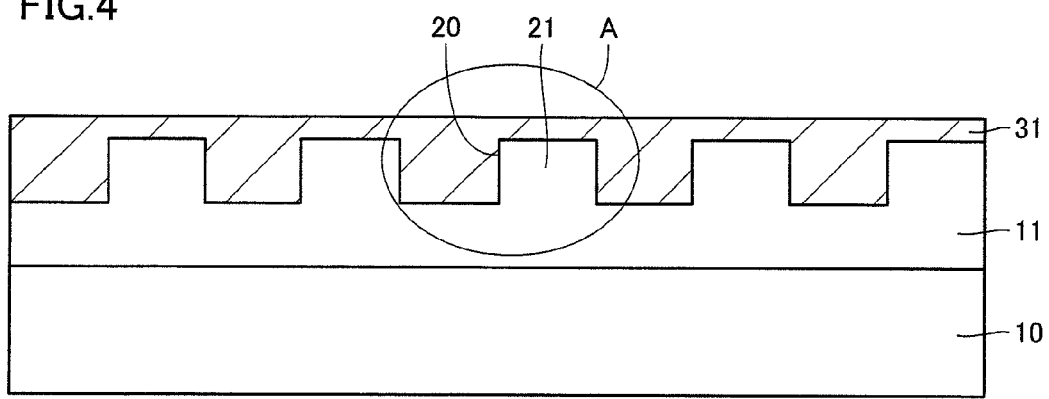
FIG. 4 is a sectional view of the semiconductor device according to one embodiment of the present invention, illustrating a second step in a fabrication method thereof.
Figure 10:
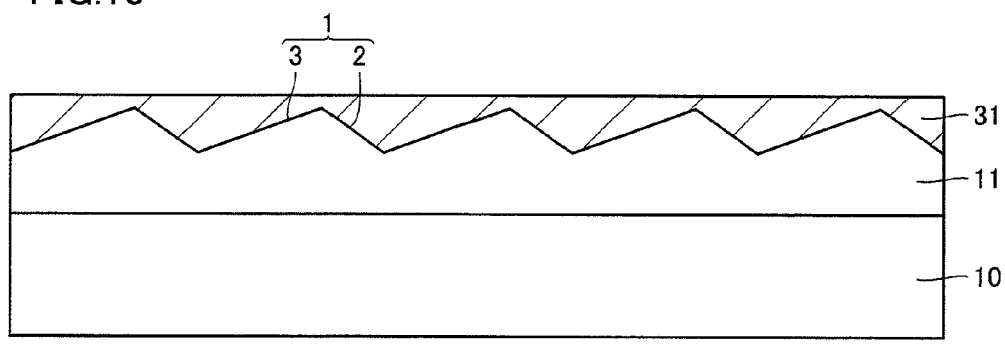
FIG. 10 is a sectional view of a third step in a method for fabricating the semiconductor device according to one embodiment of the present invention.

Next, with reference to FIG. 4, a coating film 31 made of Si is formed in a manner covering SiC film 11. Coating film 31 has a thickness of 0.1 μm, for example, in a manner filling trenches 20. This brings about a state in which Si has been supplied to the surface of SiC film 11. Subsequently, SiC film 11 is heat-treated at a temperature of about 1500° C., for example. The surface of SiC film 11 is thereby reconstructed, so that a plurality of macrosteps 1 of an equal length are formed at the surface of SiC film 11, as shown in FIG. 10.

The present embodiment illustrates the case of forming coating film 31 made of Si. However, Si may be supplied to the surface of SiC film 11 by introducing a Si-based gas to the surface of SiC film 11, instead of forming coating film 31. Alternatively, Si may be supplied to the surface of SiC film 11 by applying a Si-containing liquid to the surface of SiC film 11.

Figure 5:
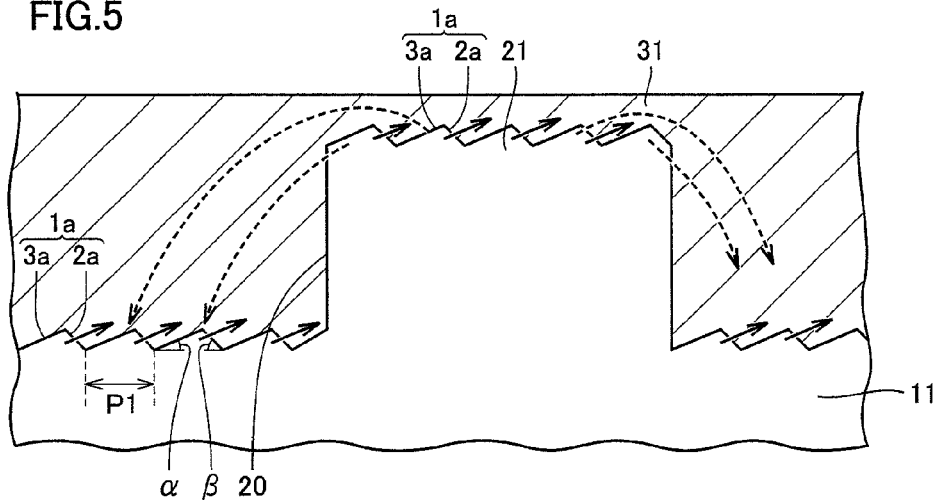
FIG. 5 is an enlarged sectional view of a portion A shown in FIG. 4, illustrating a first state in which macrosteps are formed at the surface of a SiC film.

The states in which the macrosteps are formed at the surface of SiC film 11 will now be described with reference to FIGS. 5 to 8. FIGS. 5 to 8 are enlarged views of a portion A shown in FIG. 4. With reference to FIG. 5, a large number of bunching steps 1a exist at the surface of SiC film 11 before heat treatment. Each of bunching steps 1a includes crystal planes 2a and 3a. Crystal plane 3a has a flat portion longer than crystal plane 2a, constituting a terrace of bunching step 1a. A length P1 of crystal plane 3a at bunching step 1a in the lateral direction of the drawing is about 10 nm.

Figure 6:
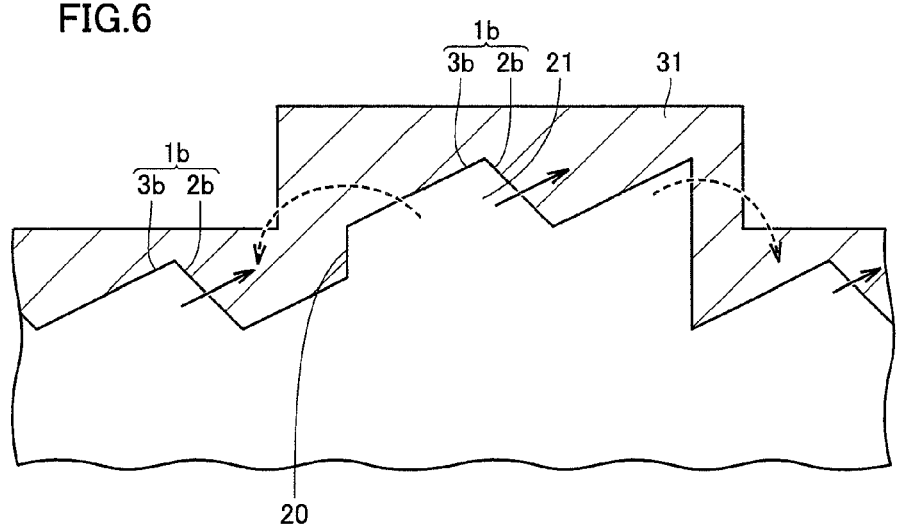
FIG. 6 is an enlarged sectional view of portion A shown in FIG. 4, illustrating a second state in which macrosteps are formed at the surface of the SiC film.

Heat-treating SiC film 11 with Si supplied to the surface of SiC film 11 causes SiC film 11 to grow in a direction along crystal plane 3a starting from crystal plane 2a as indicated by solid arrows in FIG. 5, without growing in a direction perpendicular to crystal plane 3a. Simultaneously, as indicated by dotted arrows in FIG. 5, Si atoms and carbon (C) atoms at the top of mesa portion 21 spread over the bottom of trenches 20. As a result, as shown in FIG. 6, respective bunching steps 1a converge to form macrosteps 1b each having a crystal plane 3b larger than crystal plane 3a of bunching step 1a, and the difference in level between the bottom of trenches 20 and the top of mesa portion 21 (the depth of trenches 20) is reduced.

Figure 7:
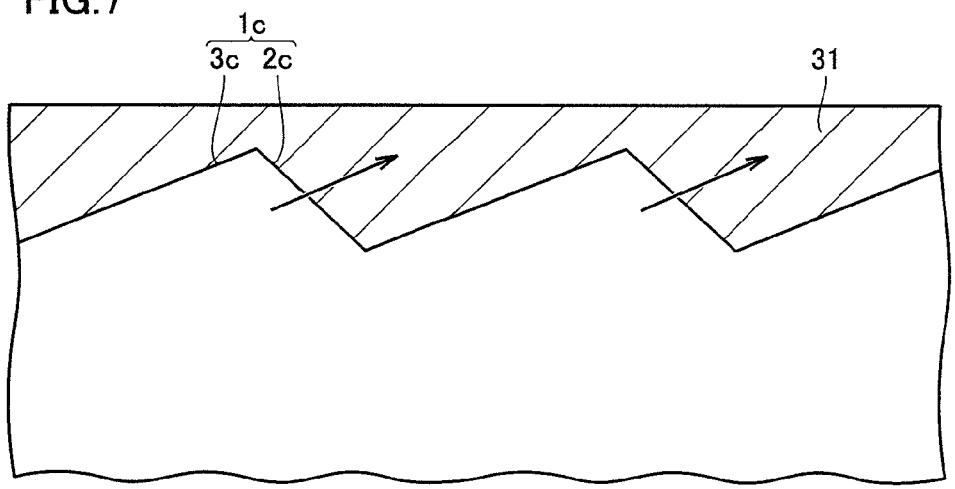
FIG. 7 is an enlarged sectional view of portion A shown in FIG. 4, illustrating a third state in which macrosteps are formed at the surface of the SiC film.

Macrosteps 1b grow further in a direction along crystal plane 3b starting from crystal plane 2b. Si atoms and C atoms at the top of mesa portion 21 spread over the bottom of trenches 20. As a result, as shown in FIG. 7, respective macrosteps 1b converge to form macrosteps 1c each having a crystal plane 3c larger than crystal plane 3b of macrostep 1b, and trenches 20 are eliminated.

Figure 8:
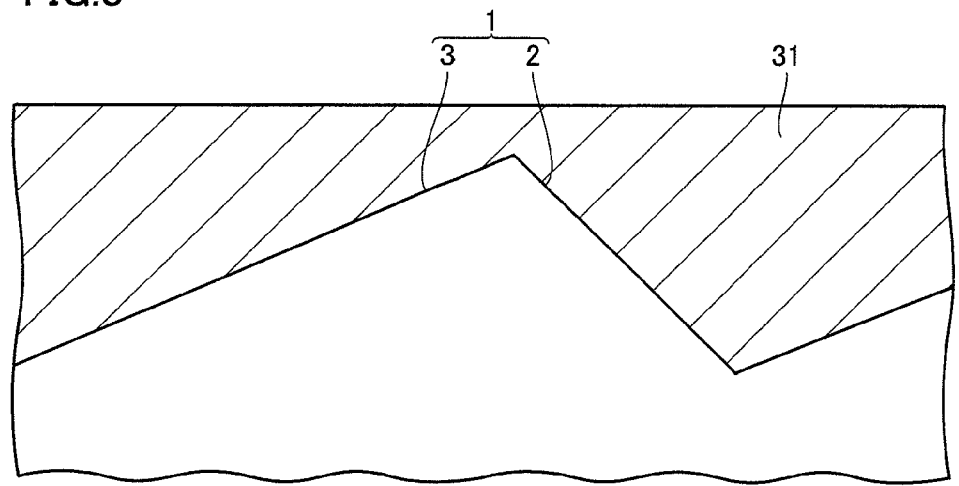
FIG. 8 is an enlarged sectional view of portion A shown in FIG. 4, illustrating a fourth state in which a macrostep is formed at the surface of the SiC film.

Macrosteps 1c grow further in a direction along crystal plane 3c starting from crystal plane 2c. As a result, as shown in FIG. 8, respective macrosteps 1c converge to eventually provide macrostep 1 having crystal plane 3 larger than crystal plane 3c of macrostep 1c. Since trenches 20 are formed at equal intervals, resultant macrosteps 1 each have en equal length (length of one cycle).

Figure 9:
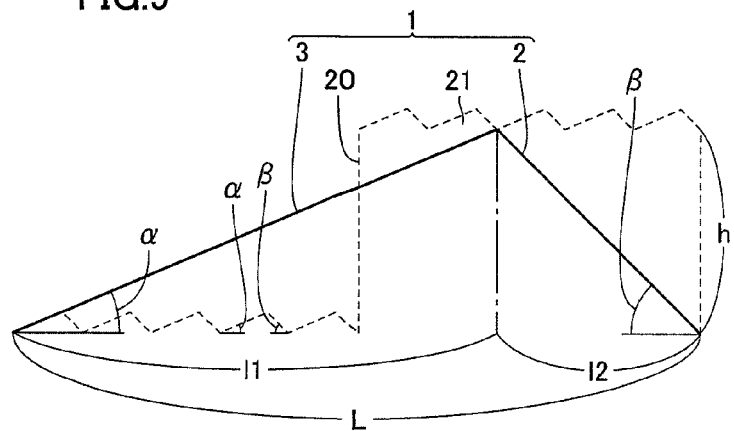
FIG. 9 shows the relationship between the length of one cycle of a trench and the length of a macrostep to be eventually obtained.

FIG. 9 shows the relationship between the length of one cycle of trenches and the length of macrostep to be eventually obtained. With reference to FIG. 9, the total length of trench 20 and mesa portion 21 in the lateral direction of the drawing in FIG. 9 (the length of one cycle of trenches 20) is equal to length L of one cycle of macrosteps 1 eventually obtained. Taking inclination angles of crystal planes 3 and 2 with respect to the lateral direction of the drawing in FIG. 9 as α and β, respectively (hereinafter, α may indicate an off-angle and β may indicate a riser angle), and the height of mesa portion 21 (depth of trenches 20) as h, a length l1 of crystal plane 3 and a length l2 of crystal plane 2 are expressed by the following Equations (1) and (2), respectively:

$$l1 = h \times \cot \alpha \quad (1)$$

$$l2 = h \times \cot \beta \quad (2)$$

Since length L of one cycle of macrosteps is equal to the sum of length l1 of crystal plane 3 and length l2 of crystal plane 2, length L is expressed by the following Equation (3):

$$L = l1 + l2 = h(\cot \alpha + \cot \beta) \quad (3)$$

Herein, to obtain flat crystal planes, crystal planes 3 and 2 are preferably inclined with respect to the surface of the SiC film. It is preferable that $0°\leq\alpha+\beta\leq90°$ and $0.5°\leq\alpha<\beta$ hold. It is more preferable that angle $\alpha$ falls within the range of $8°\pm0.5°$ and angle $\beta$ within the range of $8°\leq\beta\leq45°$. It is preferable that length L of one cycle of trenches is 1.5 μm to 1152 μm, and depth h of trenches is 0.1 μm to 20 μm. It is more preferable that depth h of trenches is 15 μm or less.

When height h of mesa portion 21 is excessively greater than length L of one cycle of trenches 20, traces of trenches 20 remain at the surface of SiC film 11, resulting in smaller terraces of macrosteps 1. When height h of mesa portion 21 and length L of one cycle of trenches 20 satisfy Equation (3), trenches 20 are filled with Si atoms and C atoms constituting mesa portion 21, consequently allowing large macrosteps 1 to be obtained.

Although the above description shows the case of heat-treating SiC film 11 at 1500° C., the temperature for heat-treating SiC film 11 preferably falls within the following range. To prevent SiC from subliming to completely decompose, a temperature of 2545° C. or below is preferable. To prevent SiC from subliming in the state of $SiC_2$, Si, $Si_2C$ or the like to some degree, a temperature of 2000° C. or below is preferable. To sufficiently prevent SiC from subliming in the state of $SiC_2$, Si, $Si_2C$ or the like to facilitate control of the surface morphology of SiC film 11, a temperature of 1800° C. or below is preferable. To further improve the surface morphology of SiC film 11, a temperature of 1600° C. or below is preferable. To cause SiC to grow to promote the formation of macrosteps, a temperature of 1300° C. or above is preferable. To improve the surface morphology of SiC film 11, a temperature of 1400° C. or above is preferable.

The heat treatment time of SiC film 11 is longer than 0, and preferably falls within the following range. To form relatively large macrosteps, a time period of 10 minutes or more is preferable. To form macrosteps having a length of one cycle of 0.5 μm or more, a time period of 30 minutes or more is preferable. Considering the productivity of semiconductor devices, a time period of 4 hours or less is preferable. To efficiently form macrosteps having a length of one cycle of 1.0 μm or more, a time period of 2 hours or less is preferable. It is to be noted that the "heat treatment time" represents a time period during which SiC film 11 is kept at a predetermined temperature, and does not include time periods for raising and lowering the temperature.

Figure 11:
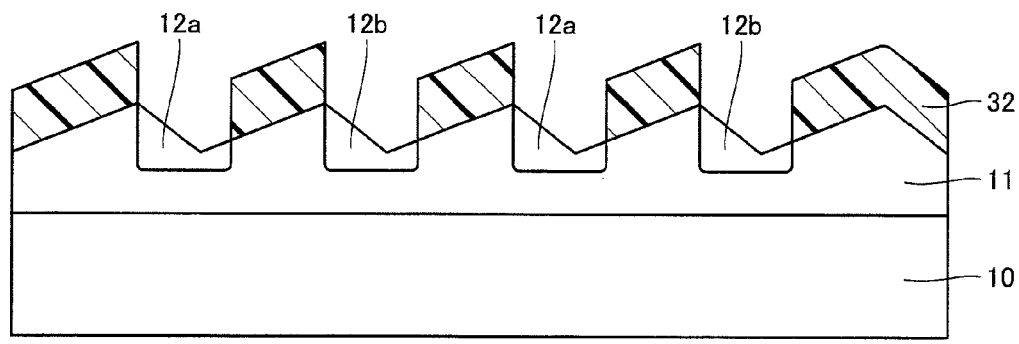
FIG. 11 is a sectional view of a fourth step in a method for fabricating the semiconductor device according to one embodiment of the present invention.

Next, with reference to FIG. 11, a resist 32 is formed on SiC film 11 in a manner covering a portion of crystal plane 3 to constitute the channel. N-type impurity ions are implanted with resist 32 serving as a mask to form n-type impurity regions 12a and 12b at the surface of SiC film 11. N-type impurity regions 12a and 12b are formed on respective sides of the portion to constitute a channel. Resist 32 is thereafter removed. Although not illustrated, p-type impurity regions may be formed in predetermined regions at the surface of SiC film 11. Resist 32 is thereafter removed, and SiC film 11 is subjected to annealing to activate n-type impurity regions 12a, 12b and the p-type impurity regions.

Figure 12:
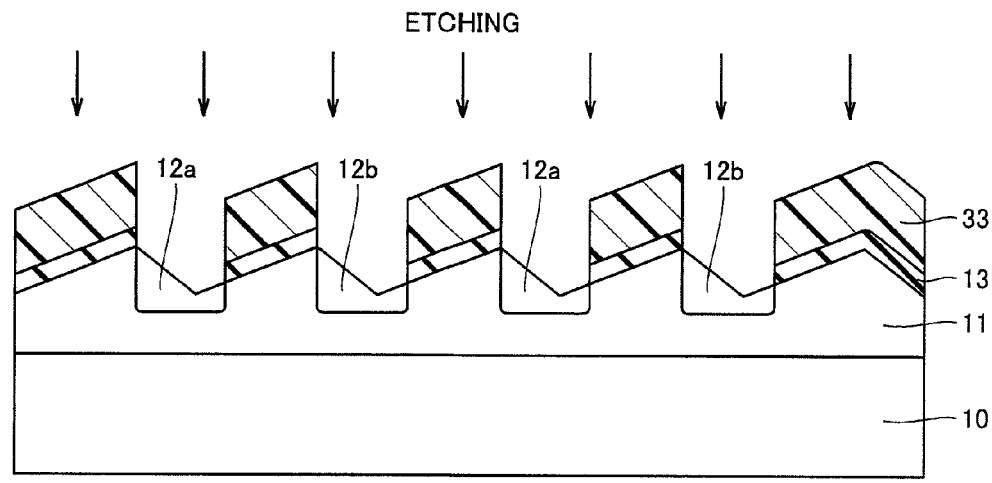
FIG. 12 is a sectional view of a fifth step in a method for fabricating the semiconductor device according to one embodiment of the present invention.

Next, with reference to FIG. 12, a sacrificial oxide film (not shown) is formed on the surface of SiC film 11, and is etched by means of etching with HCl (hydrogen chloride) or $H_2$ (hydrogen), or reactive ion etching. Alternatively, the entire surface of SiC film 11 may be polished by CMP (Chemical Mechanical Polish). The irregularities existing at the surface of SiC film 11 and damages to SiC film 11 caused by ion implantation are thereby eliminated, so that the surface of SiC film 11 is planarized. Subsequently, insulation film 13 is formed in a manner covering the surface of SiC film 11. A resist 33 is then formed on insulation film 13 except regions directly above n-type impurity regions 12a and 12b. Insulation film 13 is subjected to etching with resist 33 serving as a mask. N-type impurity regions 12a and 12b are thereby exposed. Resist 33 is thereafter removed.

Figure 13:
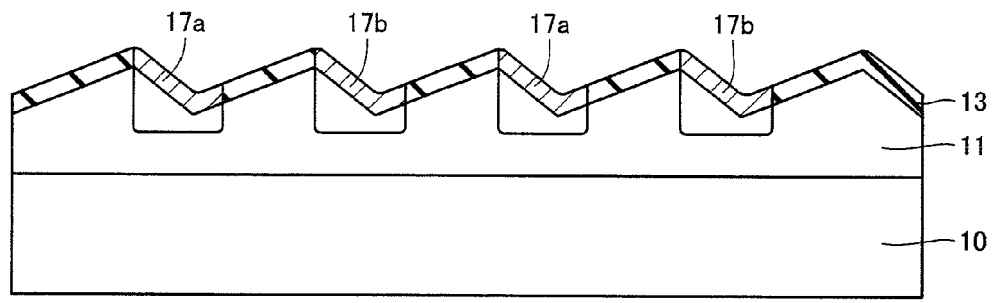
FIG. 13 is a sectional view of a sixth step in a method for fabricating the semiconductor device according to one embodiment of the present invention.

Next, with reference to FIG. 13, source electrode 17a and drain electrode 17b are formed on exposed n-type impurity regions 12a and 12b, respectively. Source electrode 17a and drain electrode 17b are formed, for example, by depositing a conductive film on insulation film 13, n-type impurity regions 12a and 12b, and then removing the conductive film on insulation film 13 by a technique such as lift-off or etching. Thereafter, source electrode 17a and drain electrode 17b are subjected to an alloy heat treatment to form gate electrode 18 on insulation film 13 between source electrode 17a and drain electrode 17b. By the above steps, semiconductor device 90 according to the present embodiment shown in FIG. 1 is completed.

Semiconductor device 90 according to the present embodiment includes SiC film 11. SiC film 11 has, at the surface thereof, a plurality of macrosteps 1 of an equal length. The plurality of macrosteps 1 constitute channels 16.

With semiconductor device 90 according to the present embodiment, the usage of macrosteps 1 to constitute channels 16 allows reduction in interface state density of the portions to constitute channels 16, which improves the carrier mobility. The semiconductor device can therefore be improved in property. Further, provision of the plurality of macrosteps 1 having equal length L of one cycle allows cyclic formation of MOSFETs 50 at the surface of SiC film 11. The semiconductor device can therefore be improved in property.

The method for fabricating semiconductor device 90 according to the present embodiment includes the steps of forming SiC film 11, forming three or more trenches 20 at the surface of SiC film 11 at equal intervals, heat-treating SiC film 11 with Si supplied to the surface of SiC film 11 and obtaining plurality of macrosteps 1 to constitute channels 16, at the surface of SiC film 11 by the heat-treating step.

With the method for fabricating semiconductor device 90 according to the present embodiment, controlling length L of one cycle and depth h of trenches 20 allows macrosteps 1 to be controlled in size. Semiconductor device 90 can thereby be obtained in which large macrosteps 1 constitute channels 16, and the semiconductor device with desired properties can be obtained. Further, since plurality of macrosteps 1 having an equal length are obtained by forming three or more trenches 20 at equal intervals, MOSFETs 50 can be formed cyclically at the surface of SiC film 11. The semiconductor device can therefore be improved in property.

The method for fabricating semiconductor device 90 according to the present embodiment includes the steps of forming SiC film 11, forming trenches 20 at the surface of SiC film 11, heat-treating SiC film 11 with Si supplied to the surface of SiC film 11 and obtaining plurality of macrosteps 1 to constitute channels 16, at the surface of SiC film 11 by the heat-treating step. Taking the length of one cycle of trenches 20 as L and the height of trenches 20 as h, a relation $L=h(\cot\alpha+\cot\beta)$ (where $\alpha$ and $\beta$ are variables that satisfy the relations $0.5°\leq\alpha$ and $\beta\leq45°$) holds between length L of one cycle and height h.

With the method for fabricating semiconductor device 90 according to the present embodiment, trenches 20 are formed based on the geometrical relationship between trenches 20 and macrosteps 1. Accordingly, large macrosteps 1 can be obtained. Since macrosteps 1 constitute channels 16, the semiconductor device can be improved in property.

Figure 14:
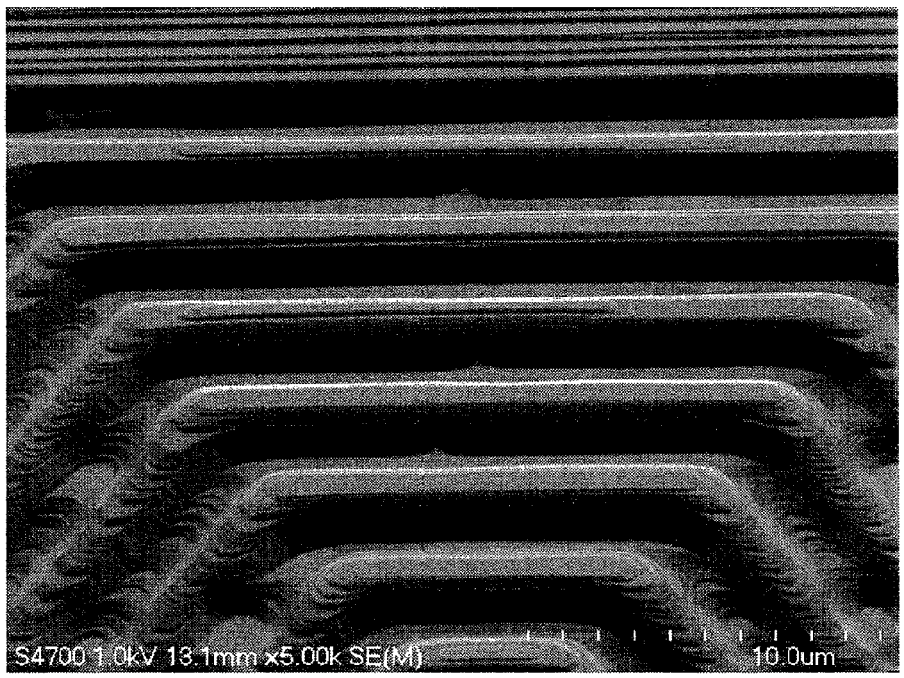
FIG. 14 is a micrograph of macrosteps when trenches having a depth of 0.4 μm are formed.
Figure 15:
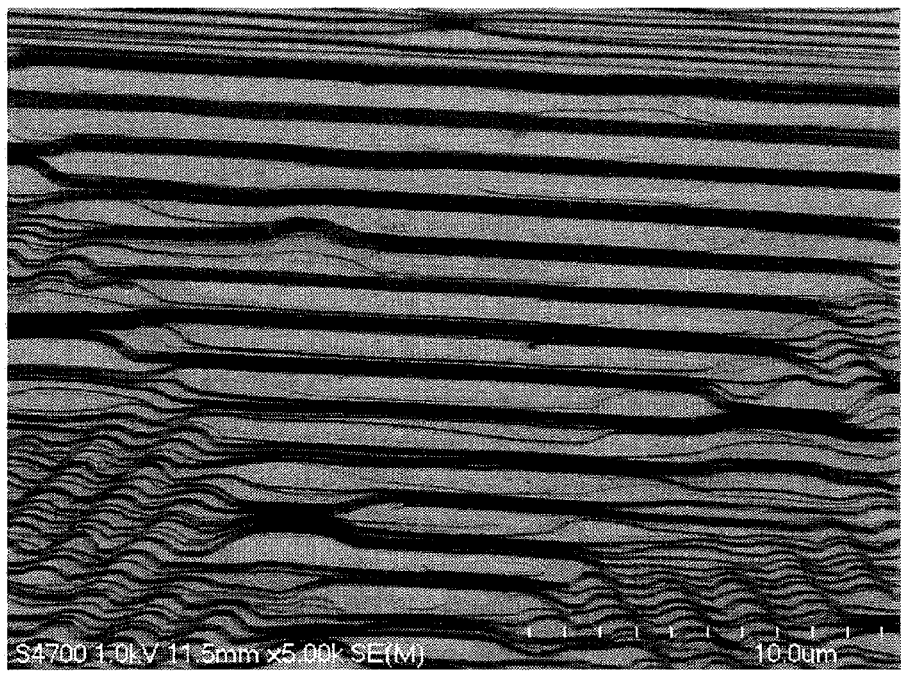
FIG. 15 is a micrograph of macrosteps when trenches having a depth of 0.1 μm are formed.

The inventor of the present invention and others formed macrosteps at the surface of a SiC film partially covered with a coating film made of Si by the fabrication method according to the present invention, and observed the surface of this SiC film. FIG. 14 is a micrograph of macrosteps obtained by forming trenches having a depth of 0.4 μm. FIG. 15 is a micrograph of macrosteps obtained by forming trenches having a depth of 0.1 μm. FIGS. 14 and 15 show that bright portions in the drawings are terraces, and macrosteps having a length of one cycle of about 2 μm have been obtained in both cases.

Example 1

Figure 16:
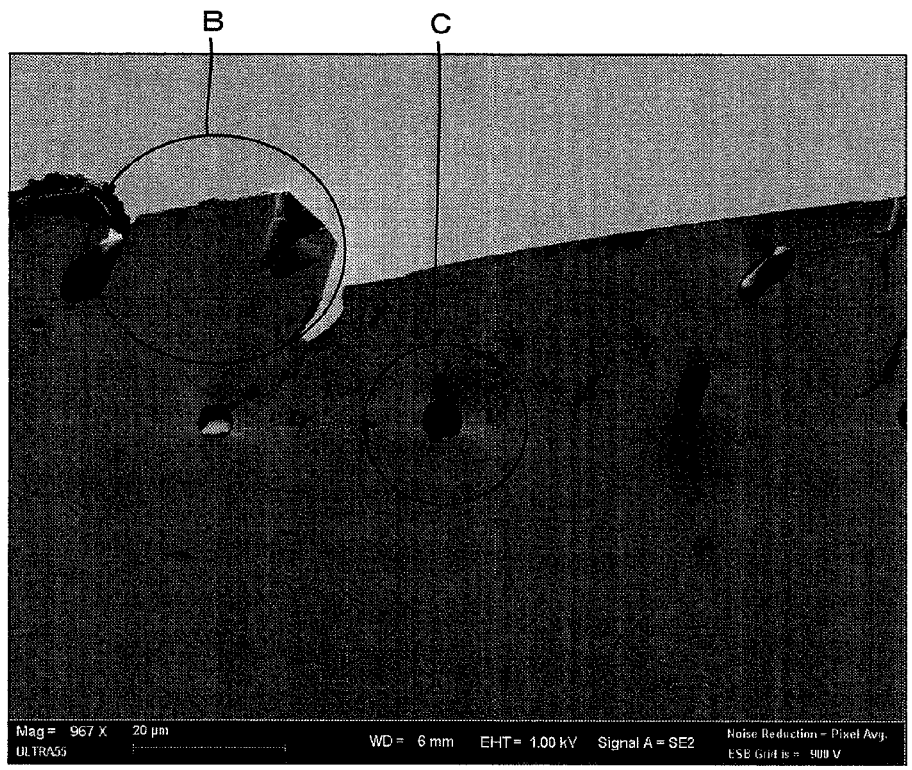
FIG. 16 shows, at (a), a micrograph of a cross section of a SiC film according to Example 2 of the present invention, and schematically shows, at (b), the shape and plane orientation of a portion B in the micrograph at (a).
Figure 16:
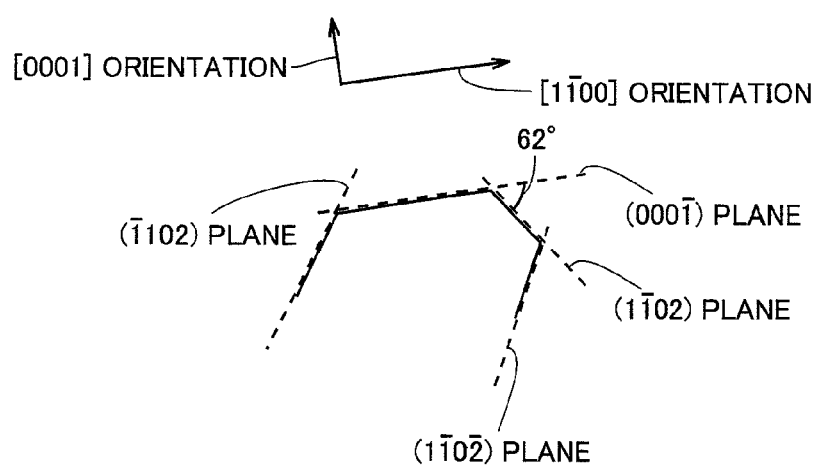

In the present example, the effect of the length of one cycle and depth of trenches formed in the SiC film on the shape of macrosteps were examined. More specifically, the semiconductor device shown in FIG. 1 was fabricated as Samples 1 to 9 by the fabrication method described in the above embodiment of the present invention. When forming trenches 20 as shown in FIG. 3, length L of one cycle (FIG. 9) and depth h (FIG. 9) of trenches 20 were altered per sample. As to Samples 1 to 9 of semiconductor devices thus obtained, the electron mobility at the channels was measured. The results are shown in Table 1.

tion of a portion B shown in the micrograph at (a). With reference to FIG. 16, large terraces are formed at the portion B in FIG. 16. These terraces are assumed to include (000-1), (1-102), (1-10-2) and (-1102) planes. Among these planes, the (000-1) plane is equivalent to the (0001) plane. Each of the (1-102), (1-10-2) and (-1102) planes forms an angle of 62° with respect to the (0001) plane.

Herein, an angle formed by the plane constituting the terraces and the (0001) plane in FIG. 16 was measured by enlarging the micrograph and measuring the angle formed by the plane constituting the terraces with respect to a [0-100] orientation. The [0-100] orientation is included both in the (0001) plane and the sheet of drawing. Considering errors) (±5°) caused by this measuring method, the plane constituting the terraces in FIG. 16 forms an angle of 62°±5° with respect to the (0001) plane.

Figure 17:
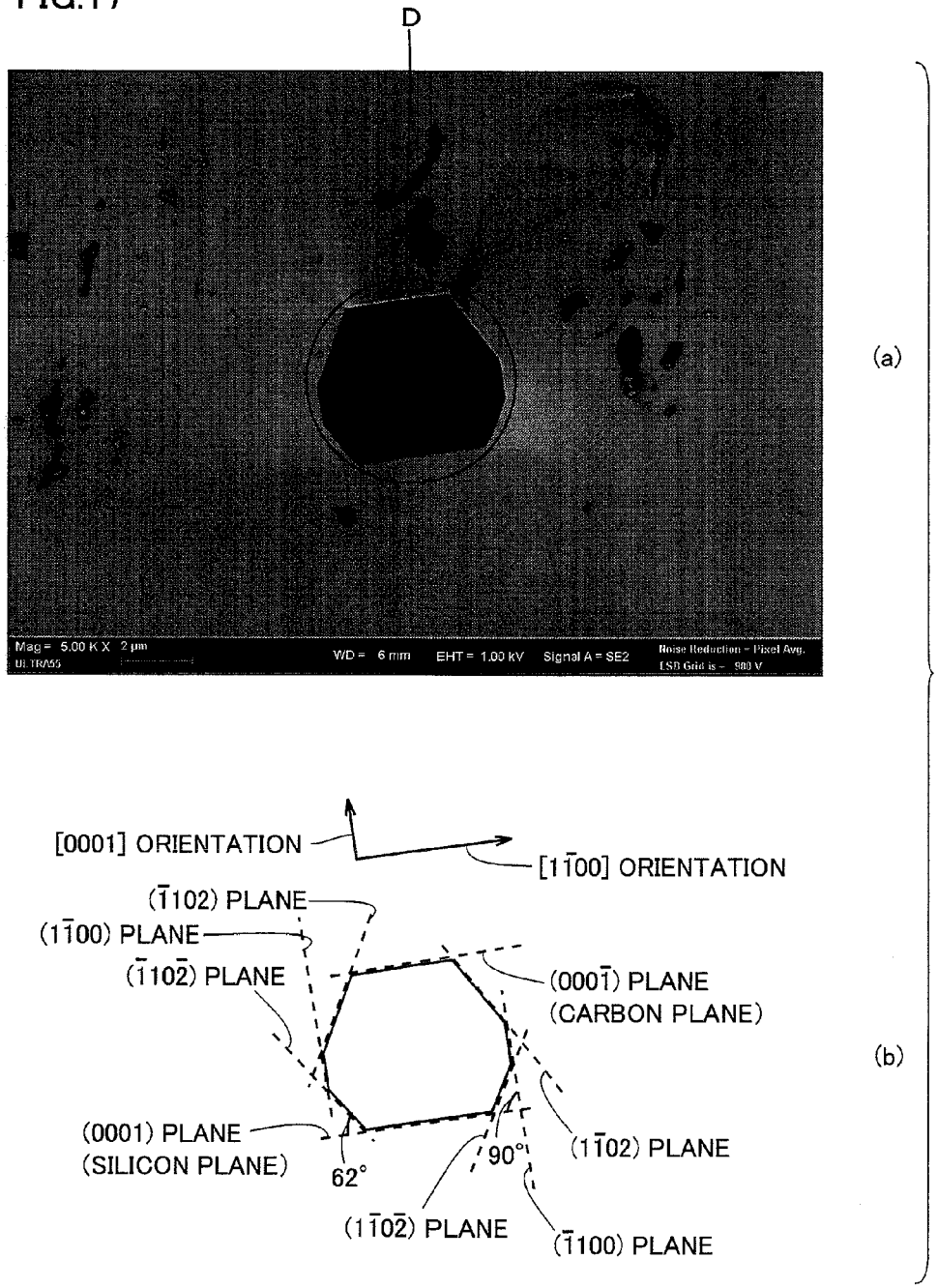
FIG. 17 enlargedly shows, at (a), a portion C shown in FIG. 16 at (a), and schematically shows, at (b), the shape and plane orientation of a portion D shown at (a).

In a portion C at (a) of FIG. 16, a void (black area) exists. FIG. 17 shows, at (a), an enlarged view of portion C shown at (a) of FIG. 16, and schematically shows, at (b), the shape and plane orientation of a portion D shown at (a) of FIG. 17. With reference to FIG. 17, the void has an octagonal shape, and is assumed to include (000-1), (1-102), (-1100), (1-10-2), (0001), (-1102), (1-100) and (-1102) planes. Among these planes, the (000-1) plane is equivalent to the (0001) plane.

TABLE 1

|  | Sample | | | | | | | | |
| --- | --- | --- | --- | --- | --- | --- | --- | --- | --- |
|  | Sample 1 | Sample 2 | Sample 3 | Sample 4 | Sample 5 | Sample 6 | Sample 7 | Sample 8 | Sample 9 |
| Off-angle α (°) | 8 | 8 | 8 | 8 | 8 | 8 | 8 | 1 | 0.5 |
| Riser angle β (°) | 60 | 60 | 60 | 60 | 60 | 60 | 60 | 60 | 60 |
| Depth of trenches h (μm) | 0.05 | 0.1 | 1 | 3 | 5 | 15 | 20 | 10 | 15 |
| Length of one cycle of trenches L (μm) | 0.7 | 1.5 | 15 | 45 | 74 | 223 | 298 | 1152 | 3446 |
| Surface morphology | C | A | A | A | A | A | B | A | C |
| Mobility ($cm^2/V_s$) | 2.1 | 60.0 | 78 | 80 | 102 | 98 | — | 102 | 1.7 |
| Reference | Low mobility | High mobility | High mobility | High mobility | High mobility | High mobility | Device fabrication is not easy. | High mobility | Length L is a calculated value. |

A: Cyclic macrosteps were obtained.
B: Although cyclic macrosteps were obtained, traces of trenches remained at the surface of the SiC film.
C: Cyclic terraces of macrosteps were obtained only partially.

With reference to Table 1, cyclic macrosteps were obtained as a whole in Samples 2 to 8. Particularly in Samples 2 to 6 and 8, no trace of trenches was observed at the surface of the SiC film. The above results show that favorable macrosteps can be obtained by forming trenches having length L of one cycle of 1.5 μm to 1152 μm and depth h of 0.1 μm to 20 μm, and more particularly, a depth of 15 μm or less.

Example 2

In the present example, stable planes in the SiC film were examined. More specifically, a coating film made of Si was formed in a manner covering the SiC film as shown in FIG. 4, and the SiC film was heat-treated at a temperature of about 1500° C. The SiC film thus obtained was cut in a plane perpendicular to the macrosteps, and the exposed cross section was observed by microscope.

FIG. 16 shows, at (a), a micrograph of the cross section of the SiC film according to Example 2 of the present invention, and schematically shows, at (b), the shape and plane orienta- Each of the (1-102), (1-10-2), (-1102) and (-1102) planes forms an angle of 62° with respect to the (0001) plane. Each of the (-1100) and (1-100) planes forms an angle of 90° with respect to the (0001) plane. Atoms at the surface of the (0001) plane are Si atoms, and atoms at the surface of the (000-1) plane are C atoms.

Figure 18:
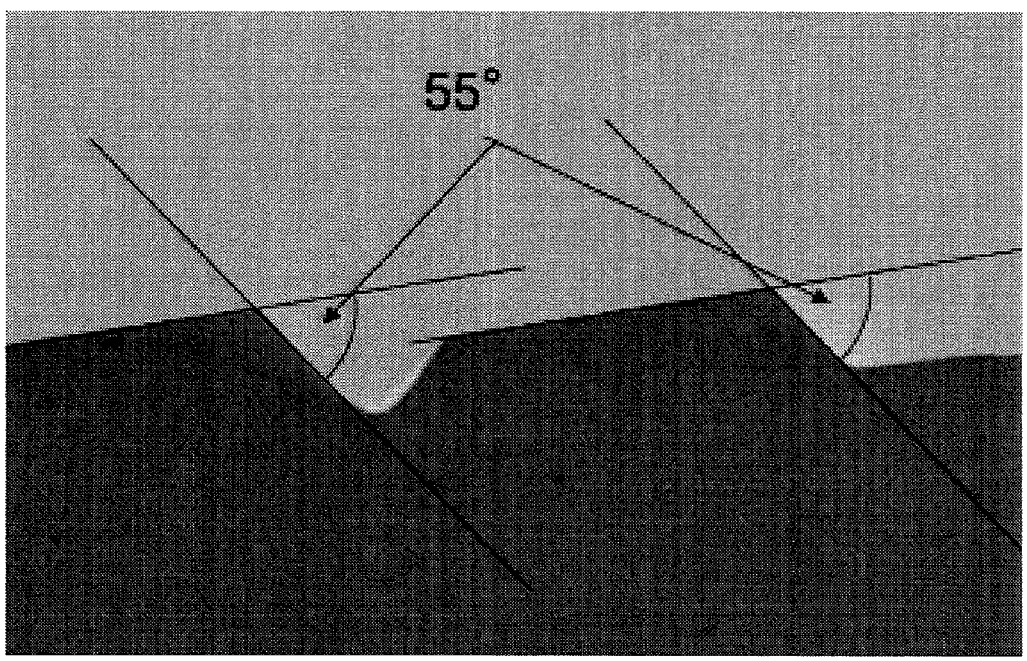
FIG. 18 is a micrograph of a cross section of another portion of the SiC film according to Example 2 of the present invention.

Further, FIG. 18 is a micrograph of a cross section of another portion of the SiC film according to Example 2 of the present invention. With reference to FIG. 18, large terraces are cyclically formed at the center of FIG. 18. These terraces each form an angle of 55° with respect to the (0001) plane.

The foregoing shows that, when viewed in a cross section perpendicular to the macrosteps, a plane forming an angle of 55°±5°, 62°±5° or 90°±5° with respect to the {0001} plane is stable.

In the above embodiment and examples, the planes and orientations may be sometimes represented by individual planes such as the (0001) plane and individual orientations such as the [1-100] orientation. However, similar effects can be obtained with any of a set of planes equivalent to the individual planes such as a {0001} plane as to the (0001) plane, and any of a set of orientations equivalent to the individual orientations such as a <1-100> orientation as to the [1-100] orientation.

It should be construed that embodiments and examples disclosed above are by way of illustration in all respects, not by way of limitation. It is intended that the scope of the present invention is defined by claims, not by the embodiments and examples above, and includes all modifications and variations equivalent in meaning and scope to the claims.

The invention claimed is:

1. A semiconductor device comprising:
 a semiconductor film made of silicon carbide, said semiconductor film having, at a surface thereof, a first macrostep, a second macrostep, and a third macrostep, each plurality of an equal length and adjacent to each other,
 three or more trenches positioned at equal intervals at the surface of the semiconductor film,
 a first channel formed at said first macrostep, a first impurity region and a second impurity region formed on respective sides of said first channel, a second channel formed at said third macrostep, and a third impurity region and a fourth impurity region formed on respective sides of said second channel,
 wherein taking a length of one cycle of said trenches as L and a depth of said trenches as h, a relation L=h(cot α+cot β) (where α and β are variables that satisfy relations $0° \leq α+β \leq 90°$ and $0.5° \leq α < β$) holds between the length L of one cycle and the depth h.

2. The semiconductor device according to claim 1, wherein at least one of said first macrostep, said second macrostep, or said third macrostep includes a {0001} plane, said {0001} plane being inclined in a <1-100> orientation within a range of −30° to +30°.

3. The semiconductor device according to claim 1, wherein the surface of said semiconductor film has a plane orientation inclined at an angle of greater than or equal to 0.5° and less than or equal to 56° with respect to a {0001} plane.

4. The semiconductor device according to claim 1, wherein at least one of said first macrostep, said second macrostep, or said third macrostep includes a plane forming an angle of 55°±5°, 62°±5° or 90°±5° with respect to a {0001} plane, when viewed in a cross section perpendicular to said first macrostep, said second macrostep, and said third macrostep.

5. A semiconductor device comprising:
 a semiconductor film made of silicon carbide, said semiconductor film having, at a surface thereof, a first macrostep, a second macrostep, and a third macrostep, each plurality of an equal length and adjacent to each other,
 three or more trenches positioned at equal intervals at the surface of the semiconductor film,
 a first channel located at said first macrostep, a first impurity region and a second impurity region located on respective sides of said first channel, a second channel located at said third macrostep, and a third impurity region and a fourth impurity region located on respective sides of said second channel,
 wherein taking a length of one cycle of said trenches as L and a depth of said trenches as h, a relation L=h(cot α+cot β) (where α and β are variables that satisfy relations $0° \leq α+β \leq 90°$ and $0.5° \leq α < β$) holds between the length L of one cycle and the depth h.

6. The semiconductor device according to claim 5, wherein at least one of said first macrostep, said second macrostep, or said third macrostep includes a {0001} plane, said {0001} plane being inclined in a <1-100> orientation within a range of −30° to +30°.

7. The semiconductor device according to claim 5, wherein the surface of said semiconductor film has a plane orientation inclined at an angle of greater than or equal to 0.5° and less than or equal to 56° with respect to a {0001} plane.

8. The semiconductor device according to claim 5, wherein at least one of said first macrostep, said second macrostep, or said third macrostep includes a plane forming an angle of 55°±5°, 62°±5° or 90°±5° with respect to a {0001} plane, when viewed in a cross section perpendicular to said first macrostep, said second macrostep, and said third macrostep.

* * * * *